(12) United States Patent
Kohno

(10) Patent No.: US 6,833,905 B2
(45) Date of Patent: Dec. 21, 2004

(54) ILLUMINATION APPARATUS, PROJECTION EXPOSURE APPARATUS, AND DEVICE FABRICATING METHOD

(75) Inventor: Michio Kohno, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/218,855

(22) Filed: Aug. 13, 2002

(65) Prior Publication Data

US 2003/0035091 A1 Feb. 20, 2003

(30) Foreign Application Priority Data

Aug. 13, 2001 (JP) .......................................... 2001-245700

(51) Int. Cl.⁷ .......................... G03B 27/54; G03B 27/42
(52) U.S. Cl. ........................................... 355/67; 355/52
(58) Field of Search .......................... 355/67, 53, 55, 355/71, 77; 378/119; 372/56; 250/504

(56) References Cited

U.S. PATENT DOCUMENTS

| 4,736,381 A | * | 4/1988 | Eden et al. ................... 372/56 |
| 5,896,438 A | | 4/1999 | Miyake et al. |
| 6,038,279 A | | 3/2000 | Miyake et al. |
| 6,437,352 B1 | * | 8/2002 | Gordon ................... 250/492.23 |
| 6,504,896 B2 | | 1/2003 | Miyake et al. |
| 2001/0055103 A1 | * | 12/2001 | Nishi ........................... 355/53 |
| 2002/0044629 A1 | * | 4/2002 | Hertz et al. ................. 378/119 |
| 2002/0191170 A1 | * | 12/2002 | Komatsuda .................. 355/67 |

FOREIGN PATENT DOCUMENTS

| JP | LO 09-115803 | 5/1997 |
| JP | LO 09-115813 | 5/1997 |
| JP | LO 09-298140 | 11/1997 |
| JP | LO 10-70058 | 3/1998 |

OTHER PUBLICATIONS

English Abstract for JPLO 09–115803.
English Abstract for JPLO 09–115813.
English Abstract for JPLO 09–298140.
English Abstract for JPLO 10–70058.

* cited by examiner

Primary Examiner—Peter B. Kim
(74) Attorney, Agent, or Firm—Morgan & Finnegan, L.L.P.

(57) ABSTRACT

A light producing apparatus for irradiating a beam from a light source to a target to produce light having a wavelength different from the beam includes a first condensing optical system for condensing the beam from the light source, and an imaging optical system for imaging onto the target under a demagnification a condensing point of the beam by the first condensing optical system.

12 Claims, 10 Drawing Sheets

ILLUMINATION APPARATUS, PROJECTION EXPOSURE APPARATUS, AND DEVICE FABRICATING METHOD

BACKGROUND OF THE INVENTION

The present invention relates to light emitting apparatuses, and more particularly to a light emitting apparatus for forming light for exposing an object such as a single crystal substrate for a semiconductor wafer and a glass plate for a liquid crystal display (LCD), an illumination apparatus using the same, an exposure apparatus, and a device fabricating method. The present invention is applicable to an exposure apparatus that uses, as exposure light, light in an extreme ultraviolet ("EUV") range with, for example, a wavelength of 20 nm to 10 nm and light in a range with a wavelength shorter than EUV.

Recent years have sought for fine semiconductor devices drastically, and demanded resolution of 50 nm or less more recently. The conventional, most effective mass production method for realizing device miniaturization has been the photolithography that uses laser with an oscillating wavelength of 200 nm or less, to be more concrete, an ArF excimer laser with a wavelength of 193 nm and $F_2$ laser with a wavelength of 157 nm.

However, the principles of optics apparently indicates that resolution obtained by using an interference of light has a limit that it is equivalent to, or at most so much as 40% of an exposure wavelength. For example, the resolution R becomes about 70 nm from the following equation when a numerical aperture (NA) of a projection lens for demagnified transfer is raised as high as 0.7 with a pattern on an original (such as a mask or reticle) as an object plane and a wafer plane as an image plane, $F_2$ laser is used, and a proportional constant $k_1$ is 0.3:

$$R = k_1 \frac{\lambda}{NA}$$

Therefore, an excimer waveband cannot necessarily satisfy the recent miniaturization requirement down to a resolution of 50 nm or less.

Accordingly, an exposure method has recently been proposed which uses EUV light with a wavelength shorter than an excimer beam (soft-X-ray with, e.g., a wavelength of about 13~14 nm). Given the EUV light, a resolution of 30 nm or less can be obtained from the above equation even when the NA is, for example, 0.3, and the proportional constant $k_1$ is, for example, 0.64. It would thus possible to establish the NA of a projection lens to be small, and ensure a permissible range of a device manufacturing process represented by the proportional constant $k_1$.

The EUV light occurs when an excitation beam from a light source (i.e., excitation beam light source) is condensed onto a target to excite the target.

Here, a fluctuating light exit direction of a beam from the excitation beam light source accordingly fluctuates a position at which the beam is irradiated onto the target, and consequently a EUV-generating light emission point. In addition, the fluctuations in the EUV-generating light emission point negatively influence the performance of an illumination apparatus and exposure apparatus that use the generated EUV light.

BRIEF SUMMARY OF THE INVENTION

Accordingly, it is an object of the present invention to provide a light producing apparatus whose EUV-generating light emission point is not so affected even when a light exit direction of a beam from an excitation beam light source fluctuates, an illumination apparatus using the same, an exposure apparatus, and a device fabricating method.

A light producing apparatus of one aspect of the present invention for irradiating a beam from a light source to a target to produce light having a wavelength different from the beam includes a first condensing optical system for condensing the beam from the light source, and an imaging optical system for imaging onto the target under a demagnification a condensing point of the beam by said first condensing optical system.

An illumination apparatus of another aspect of the present invention for illuminating an illuminated plane using light produced by the above light producing apparatus. The light produced by the light producing apparatus has, but is not limited to, a wavelength of 20 nm or less.

The illumination apparatus may include a second condensing optical system for condensing the light from the light producing apparatus, an optical integrator for receiving light from said second condensing optical system, and a first condenser system for superimposing a plurality of beams emitted from said optical integrator onto the illuminated plane. A configuration of the optical integrator that uniformly illuminates the illuminated plane would prevent uneven illuminance at the illuminated plane.

In one embodiment, the second condensing optical system includes a condensing mirror for condensing light from said light producing apparatus, and a second condenser system for condensing light from the condensing mirror into said optical integrator, wherein an aperture of the condensing mirror and an incident surface of said optical integrator are arranged optically conjugate with each other. Since the condensing mirror has the fixed aperture conjugate with the incident surface of the optical integrator, a positional offset of the light emission point under this configuration would not affect a light amount distribution of the optical integrator.

In another embodiment, the second condensing optical system may include a condensing mirror for condensing light from said light producing apparatus, and a second condenser system for condensing light from the condensing mirror into the optical integrator, and wherein the target of said light producing apparatus and an incident surface of the optical integrator are arranged optically conjugate with each other.

The illumination apparatus may further include a second condensing optical system for condensing light from said light producing apparatus onto the illuminated plane, the second condensing optical system comprising a plurality of condensing mirrors, wherein respective beams from the plurality of condensing mirrors illuminate a common illumination region on the illuminated plane. The beam from the light source may be a laser beam or an electron beam. A laser beam would be excitation laser (e.g., excimer laser, YAG laser, semiconductor laser, and solid state laser).

An exposure apparatus as still another aspect of the present invention uses the above illumination apparatus to illuminate a pattern of an original to project the pattern onto an exposed object by using a projection optical system. Such an exposure apparatus also exhibits operations similar to those of the above illumination apparatus.

A device fabricating method as still another aspect of the present invention includes the steps of projecting and exposing an object with a device pattern of an original by using the above exposure apparatus and performing a predetermined process for the object exposed. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

A detailed description will now be given of an exposure apparatus 100 of a first embodiment according to the present invention, with reference to accompanying drawings. The inventive exposure apparatus 100 is a projection exposure apparatus that uses, as illumination light for exposure, EUV light (e.g., with a wavelength of 13.4 nm) emitted from a light emission point Pt to perform a step-and-scan exposure.

Figure 1:
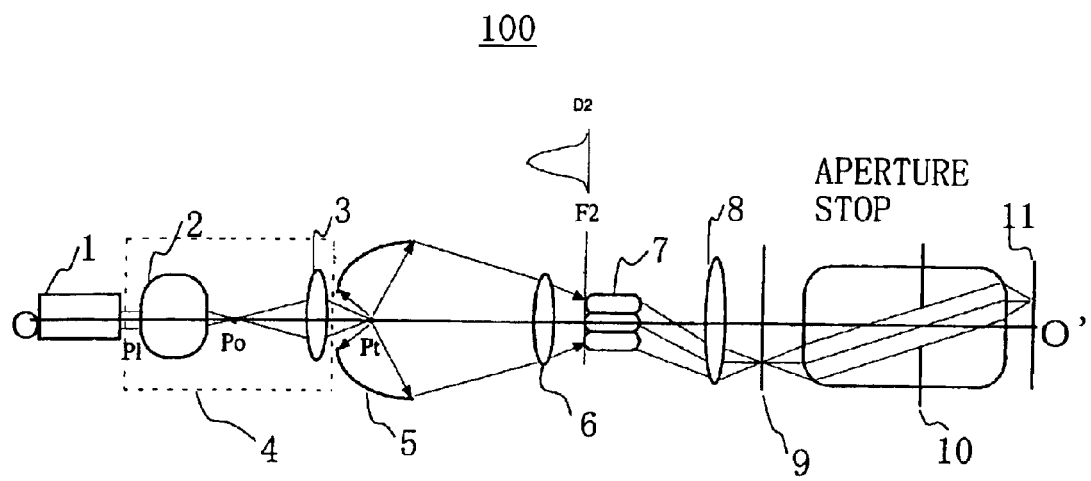
FIG. 1 is a schematic diagram showing an exposure apparatus of a first embodiment of the present invention.

As shown in FIG. 1, the exposure apparatus 100 includes a light emitting apparatus, an illumination optical system, a mask 9 as an original, a projection optical system 10 and a wafer 11. The light emitting apparatus and illumination optical system form an illumination apparatus. The illumination apparatus uses EUV light to illuminate the mask as an illuminated plane.

The light emitting apparatus, which condenses excited laser beams onto a target (not shown), includes excitation laser 1 and an excitation laser optical system 4 for emitting EUV rays of light from a light emission point Pt corresponding to this light condensing position.

The excitation laser 1 is an exemplary excitation light source, which is an excimer laser in this embodiment. However, an excitation light source according to the present invention is not limited to the excimer laser, but is applicable to YAG laser or other excitation laser, which will be described later. The excitation light source also includes an electron-ray light source. The excitation laser 1 of this embodiment emits a parallel ray, but as described later, the present invention is applicable to laser that emits a divergent ray.

An excitation optical system 4, arranged between the excitation laser 1 and light emission point Pt, introduces a laser beam from the excitation laser 1 to the light emission point Pt, and includes a condensing optical system 2 and a demagnification imaging optical system 3. Of course, the excitation optical system 4 may further include other optical systems (such as, e.g., a relay system and a collimating system).

The condensing optical system 2 condenses a laser beam emitted from an exiting edge P1 of the excitation laser 1 to a condensing point Po. The condensing optical system 2 of this embodiment includes, e.g., a condenser lens that condenses a parallel ray. The condensing optical system 2 may also include a demagnification imaging optical system. Further, the condensing optical system 2 may include a negative refractive power as a whole, and the condensing point Po may be a virtual image. The shape of an optical spot at the condensing point Po may be a circle or a line.

The demagnification imaging optical system 3 forms the above laser beam condensed to the condensing point Po by the condensing optical system 2 onto the light emission point Pt under a demagnification. The demagnification imaging optical system 3 includes a single convex lens, a plurality of convex lenses, or a combination of convex and concave lenses (for example, a combination of convex, concave and convex lenses). As mentioned above, the demagnification imaging optical system 3 regardless of whether the condensing optical system 2 includes a demagnification imaging optical system.

Arranged at the light emission point Pt are a nozzle (not shown) that continuously jets a droplet (e.g., Xe) used as a target for plasma generation at regular intervals, a droplet recovery part (not shown) that recovers the droplet for reuse when an excitation ray is not irradiated, and a filter (not shown) for cutting particles (debris) scattering from the plasma and from around it or cutting a wavelength unnecessary for EUV exposure.

This embodiment uses the droplet of Xe as the target, but the target may use a cluster to jet Xe gas from the nozzle into a vacuum space and use adiabatic expansion, a solidified substance to cool the Xe gas on a metallic surface, or a metallic tape such as Cu.

The illumination optical system uses arc-shaped EUV light corresponding to an arc-shaped field of the reflection type demagnification projection optical system 10 to uniformly illuminate the mask 9, and includes a condensing mirror system 5, mirror condenser systems 6 and 8, and an optical integrator 7. The illumination optical system is thus comprised, although comprised of lenses in figures, of a mirror reflection system in this embodiment. As described later, the projection optical system 10 is also comprised of a mirror system. The reason why the illumination optical system and projection optical system 10 include a mirror system is that, as discussed, there exist no glass material that may transmit EUV light efficiently.

As the EUV light has low transmittance in the air, the exposure apparatus 100 is housed in a vacuum container (not shown). The present invention is applicable only when an optical path for the EUV light to travel through is maintained in a vacuum atmosphere. The demagnification imaging optical system 3 may be housed in such a vacuum container.

The condensing mirror system 5 serves to condense and abstract EUV light, and includes a spheroid mirror in this embodiment. A spheroid mirror is filmed with reflective multilayer films for efficiently reflecting EUV light. Since it partially absorbs radiant energy from the high-temperature plasma Pt, its temperature becomes very high during exposure. The mirror uses such a material as metal with high thermal conductivity, and a cooling mechanism (not shown) to cool it all the time.

The mirror condenser system 6 condenses to the optical integrator 7 EUV light condensed by the condensing mirror 5, and arranges the light emission point Pt of the EUV light on the target optically conjugate with an light incidence plane F2 of the optical integrator 7 (or light incidence/exit plane in this embodiment in which light incidence and exit planes are the same) (in other words, in a positional relationship between an object plane and an image plane). This would increase the illuminance at the incident plane F2 of the optical integrator.

Figure 10A:
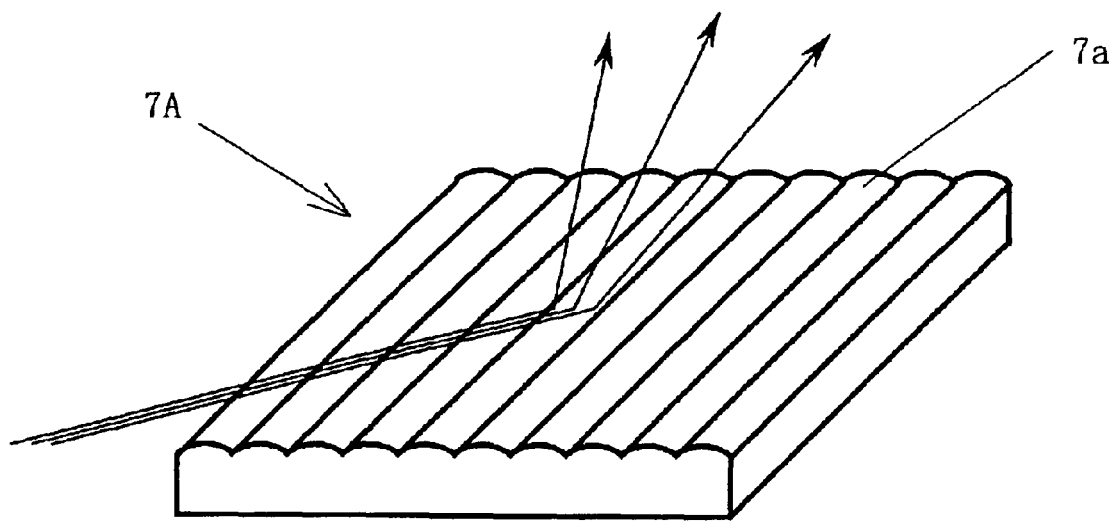
FIG. 10 is a schematic perspective view showing two reflection types of optical integrators applicable to the optical integrator of the exposure apparatus shown in FIG. 1.
Figure 10B:
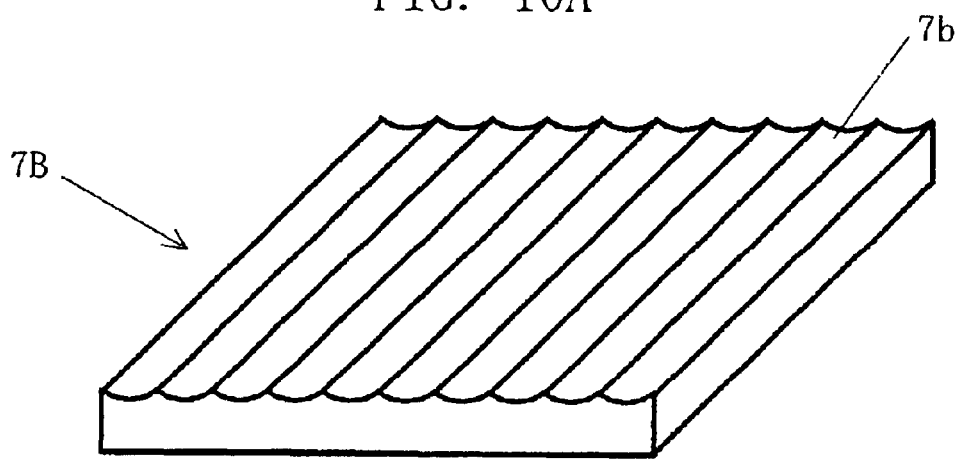
Figure 11:
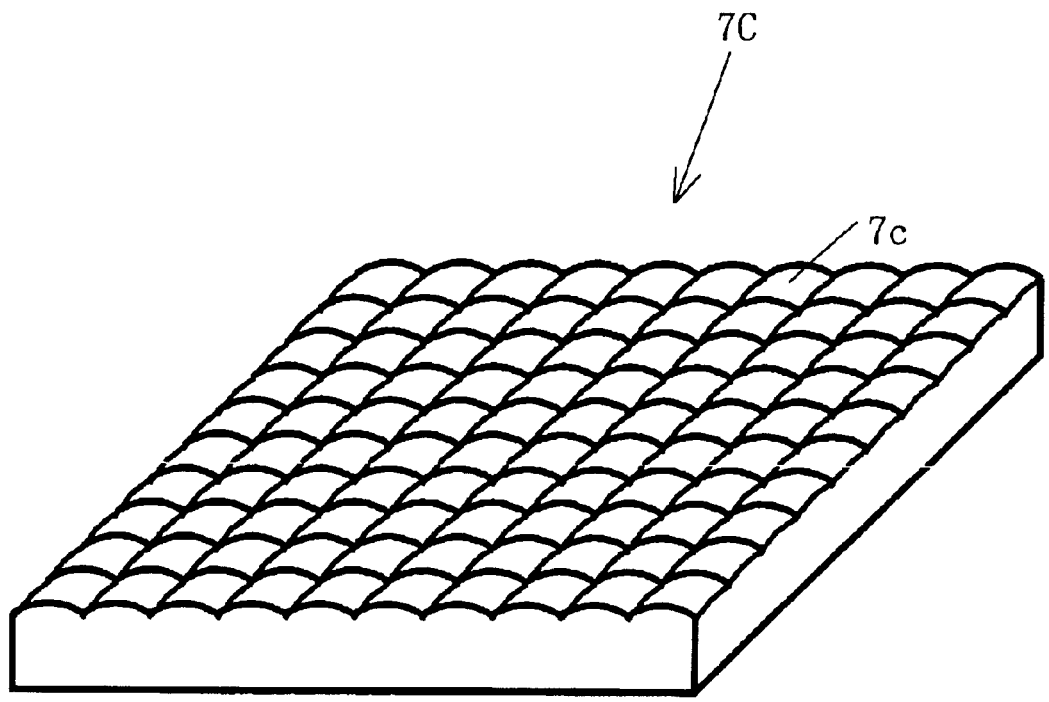
FIG. 11 is a schematic perspective view showing a variation of the reflection type optical integrators shown in FIG. 10.

The optical integrator 7 receives the EUV light condensed by the condensing mirror system 5, thus forming a secondary light source for uniformly illuminating the mask. This embodiment makes the optical integrator 7 of a reflection type optical integrator 7A, shown in FIG. 10A, which has a plurality of reflection type convex-shaped cylindrical surfaces 7a. However, the optical integrator 7 may include a reflection type optical integrator 7B, shown in FIG. 10B, which has a plurality of reflection type concave-shaped cylindrical surfaces 7b. Alternatively, it may include a fly-eye mirror 7C, shown in FIG. 11, which two-dimensionally arranges multiple fine convex or concave spherical surfaces 7c with a repetitive cycle.

A mirror condenser system 8 condenses a beam emitted from the optical integrator 7 onto the mask, thus Koehler-illuminating the mask.

The reflection type mask 9 has a non-reflective part including an EUV absorber on top of a multilayer film reflection mirror, and a pattern to be transferred, and is mounted on a mask stage (not shown).

The projection optical system 10 includes a plurality of multilayer film reflection mirrors, and projects a pattern on the mask 9 in a demagnification manner onto the wafer 11's surface, while maintaining an image-side telecentric system. The object side (i.e., the reflection type mask side) is usually adapted to be telecentric in order to avoid a physical interference with an illumination beam incident upon the reflection type mask 9.

Figure 2:
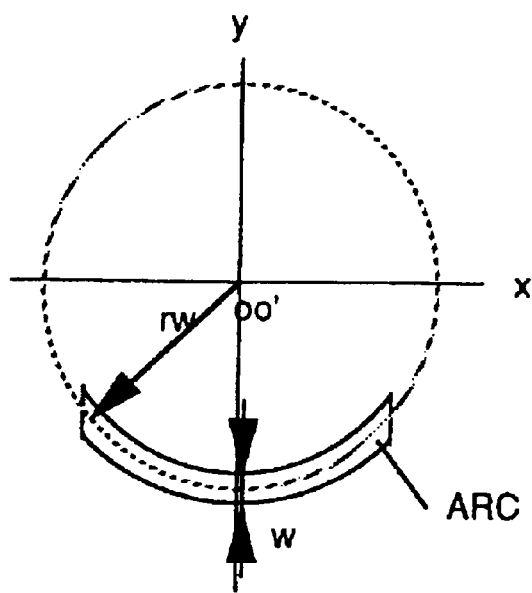
FIG. 2 is a diagram showing an example of an exposure area of a projection optical system used for the exposure apparatus shown in FIG. 1.

It is conceivable that the projection optical system 10 may use such an optical system as corrects aberration only in an off-axis effective image area (with a radius of "rw") (the area ARC with a slit-width w) as shown in FIG. 2, and illuminates the area to synchronously scan the mask 9 and wafer 11. Here, FIG. 2 is a diagram that shows an exposure area of the projection optical system 10.

The wafer 11, fixed to a wafer stage (not shown), serves to move up and down, forward and backward, right and left in parallel to paper, and its movement is controlled by a measuring machine such as a laser interferometer (not shown). The entire area is exposed, for example, by synchronously scanning the wafer stage in a direction parallel to the paper at a speed of v·M where M is the magnification of the projection optical system 10 and v is a speed to scan the reflection type mask 9 in a direction parallel to the paper.

This embodiment uses the wafer 11 as an exemplary object to be exposed, but the present invention covers a wide range of objects such as a liquid crystal substrate, spherical semiconductor, and the like. Photo-resist is applied to the wafer 11. A photo-resist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo-resist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

Figure 3:
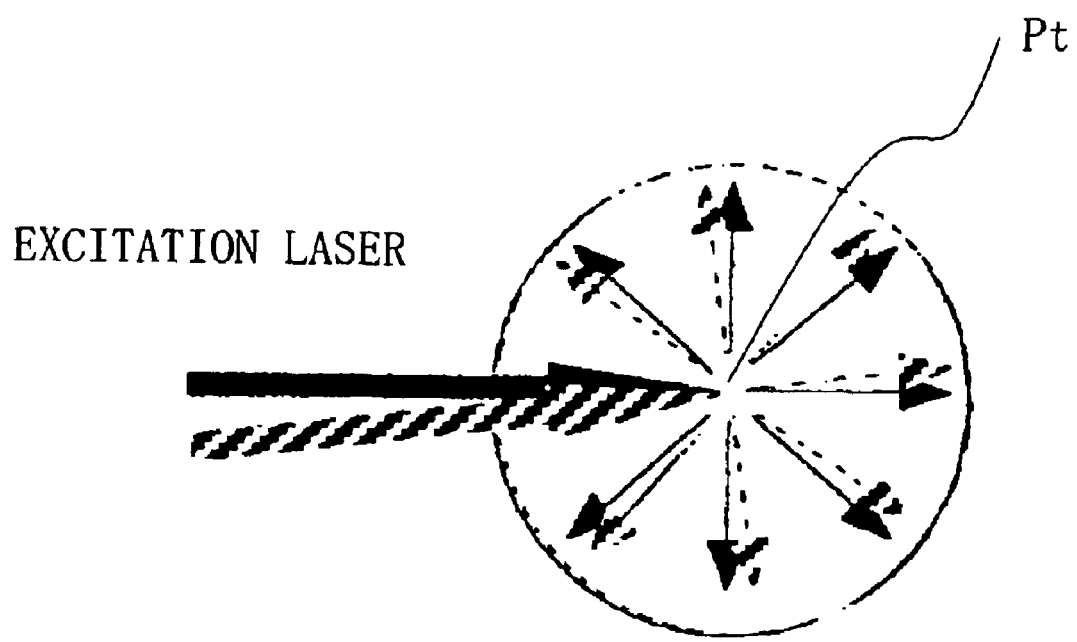
FIG. 3 is a view showing how a laser beam introduced from an excitation laser to a light emission point emits EUV light.

In exposure, a parallel laser beam emitted from the exiting edge P1 of the excitation laser 1 is condensed to the point Pt as illustrated by the action of the excitation optical system 4. The excimer laser excites rare gas from the light emission point Pt, thus producing the EUV light. At the time of EUV light emission, the divergent angle is a solid angle of $4\pi$. As is shown in FIG. 3, it is isotropic (omnidirectional), independently of the incident direction of the excitation laser 1. Therefore, a fluctuating incident angle to the light emission point Pt of the excitation laser 1 practically has no impact on the divergent angle of the EUV light. Here, FIG. 3 is a diagram showing how EUV light is emitted.

A positional change to the light emission point Pt of the excitation laser 1 has an impact to the exposure performance. In other words, it causes a displacement of an effective light source and property offsets in a resolved pattern on the wafer 11.

Figure 4:
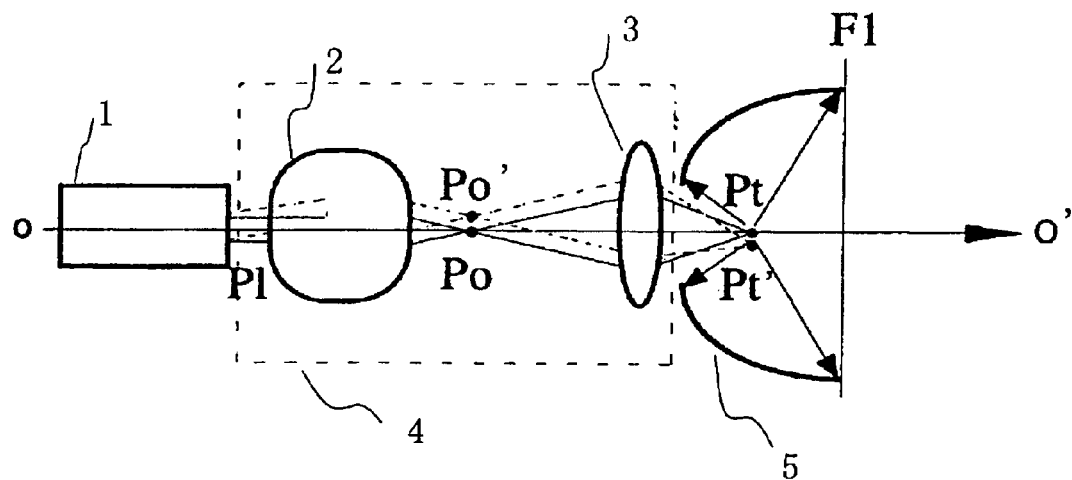
FIG. 4 is a view showing angular changes of excitation laser of the exposure apparatus shown in FIG. 1.

The condensing optical system 2 condenses a parallel beam from the excitation laser 1. Indeed, an interval between the excitation laser 1 and light emission point Pt is generally inaccessible due to various conditions such as a purge of the rare gas. In other words, the focal distance f of the condensing optical system 2 cannot but be enlarged. However, if enlarged, as shown in FIG. 4, when the angle of the laser beam is deflected by a small degree of $\alpha$ at the exiting edge P1 of the excitation laser 1, the position of the primary condensing point Po will shift by $f\alpha$ (Po' in FIG. 4), and thus the greater the f is, the bigger the amount of offset from the optical axis OO' of the condensing point Po becomes. Here, FIG. 4 is a schematic view for explaining angular changes in the excitation laser 1.

Accordingly, if the primary condensing point Po were exactly the light emission point of the EUV light, the mirror system 5 enlarges the amount of this displacement, thus causing a large offset in a beam distribution on the incident plane F2 of the optical integrator 7. This will result in displacement of the effective light source that exposes the wafer 11, causing characteristic offsets in a resolved pattern on the wafer 11. As a solution for this problem, the present invention arranges the demagnification imaging optical system 3 inside the excitation optical system 4.

The demagnification imaging optical system 3 serves to re-image under a demagnification ($\beta$<1) the primary condensing point Po created by the condensing optical system 2. This forms the secondary condensing point at Pt, which becomes the light emission point for the EUV light. An introduction of the demagnifying imaging optical system 3 would maintain an angular offset α of the excitation laser to be a minimum (fαβ) at the light emission point Pt.

Figure 5:
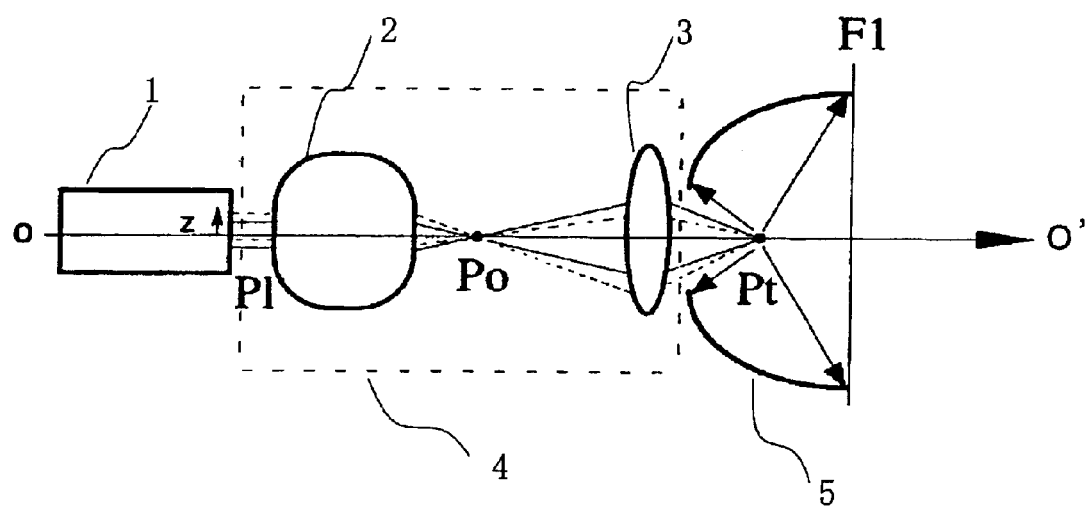
FIG. 5 is a view showing positional changes of excitation laser of the exposure apparatus shown in FIG. 1.

A demagnification system would generally enhance angular sensitivity at the light emission point Pt. The reason is that as shown in FIG. 5, when the excitation laser 1 causes a positional change z, an amount of the laser beam's angular displacement is produced as much as z/f at the point Po, and is doubly increased by z/(fβ) at the light emission point Pt. Here, FIG. 5 is a schematic view for explaining the angular change of the excitation laser 1. The isotropy of the EUV emission eliminates this angular offset, as described above by referring to FIG. 3, without causing a change of an effective light source in the illumination system in the later stage.

The EUV light emitted from the light emission point Pt diverges in almost all directions, but some scores of percents thereof are caught by the condensing mirror system 5. Reflection light from the condensing mirror system 5 is further condensed by the mirror condenser system 6 to the incident plane F2 of the optical integrator 7. In FIG. 1, D2 shows an exemplary light amount distribution at the incident plane F2 of the optical integrator 7. Plurality of beams emitted from the optical integrator 7 Koehler-illuminate the mask 9 through the mirror condenser system 8, pass through the projection optical system 10, and finally reach the wafer 11.

Figure 14:
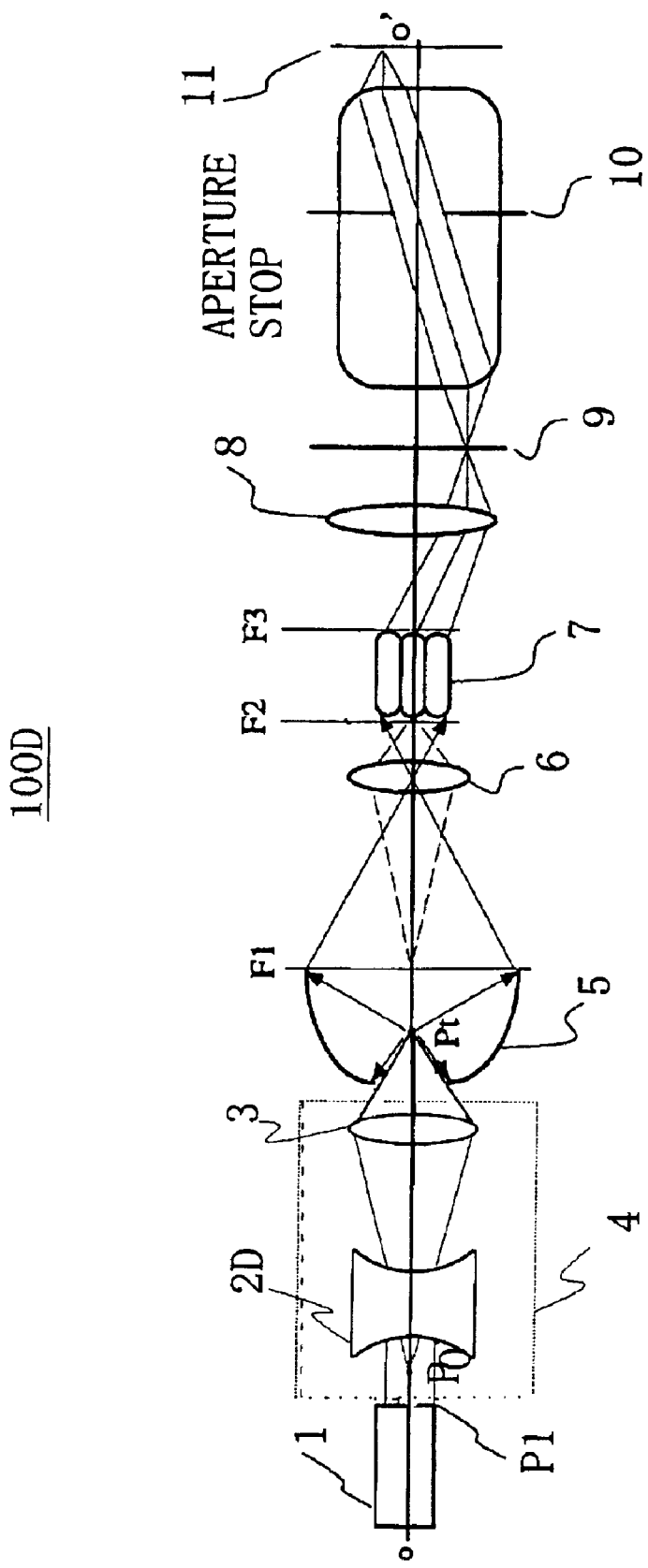
FIG. 14 is a schematic diagram showing an exposure apparatus of a fifth embodiment of the present invention.

A description will now be given of an exposure apparatus 100D of a fifth embodiment according to the present invention by referring to FIG. 14. The exposure apparatus 100D has the same basic structure as that of the exposure apparatus 100, and differs in that it uses a condenser optical system 2D for a condensing optical system, which has a negative refractive power as a whole. The condensing optical system 2D makes parallel laser beams emitted from the exiting edge P1 of the excitation laser 1 divergent from the condensing point Po' which is a virtual image and the demagnification imaging optical system 3 condenses them, in turn, to the light emission point Pt. FIG. 14 shows the condensing optical system 2D as one block, but it may actually be more than one optical systems.

The inventive demagnifying imaging optical system 3 works even in this case.

Figure 6:
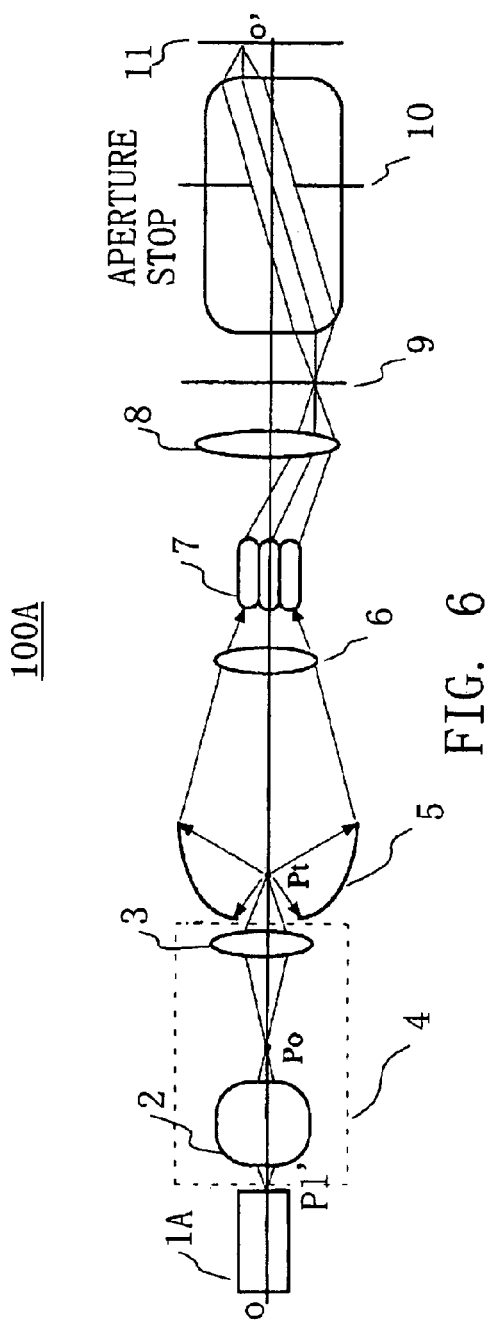
FIG. 6 is a schematic diagram showing an exposure apparatus of a second embodiment of the present invention.

A description will now be given of an exposure apparatus 100A of a second embodiment of the present invention with referring to FIG. 6. The exposure apparatus 100A has the same basic structure as that of the exposure apparatus 100, and differs in that it uses an excitation laser 1A that emits divergent light in place of the excitation laser 1 that emits parallel light. As described above, the excitation laser 1 is excimer laser or gas laser, but the present invention is also applicable to the excitation laser 1A that emits divergent laser beams such as a semiconductor laser and a solid laser.

In order to apply the instant invention to this configuration, the condensing optical system 2 is made an imaging system. FIG. 6 shows the condensing optical system 2 as one block, but it can indeed be multiple optical systems. This is because the optical length should be long enough to provide a purge space between the excitation laser 1A and EUV light emission point Pt. Then, an imaging magnification from the excitation laser 1A to the primary condensing point Po tends to be large due to an intervened relay system, etc. The inventive demagnifying imaging optical system 3 also works even in this case. Even when the exiting point P1' of the excitation laser 1A fluctuates its position, the change at the light emission point Pt is maintained minimum. Although an offset in the divergent angle at the exiting point P1' would cause an angular offset in the excitation light at the point Pt since the point P1 and the point Pt are conjugate with each other, the isotropy of the EUV ray described above with reference to FIG. 3 eliminate this angular offset and thus fluctuations in the effective light source in the illumination system in the later stage.

A description will now be given of an exposure apparatus 100B of a third embodiment of the present invention. The exposure apparatus 100B has the same basic structure as that of the exposure apparatus 100, wherein it has arranged the aperture plane F1 of the condensing mirror to be conjugate with the incident plane F2 of the optical integrator 7 by using the mirror condenser system 6. The condensing mirror system 5 has the fixed aperture part F1 conjugate with the incident plane F2 of the optical integrator 7, and this arrangement may stabilize the outline of the effective light source on the incident plane F2 when the EUV light emission point Pt changes its position.

Figure 8:
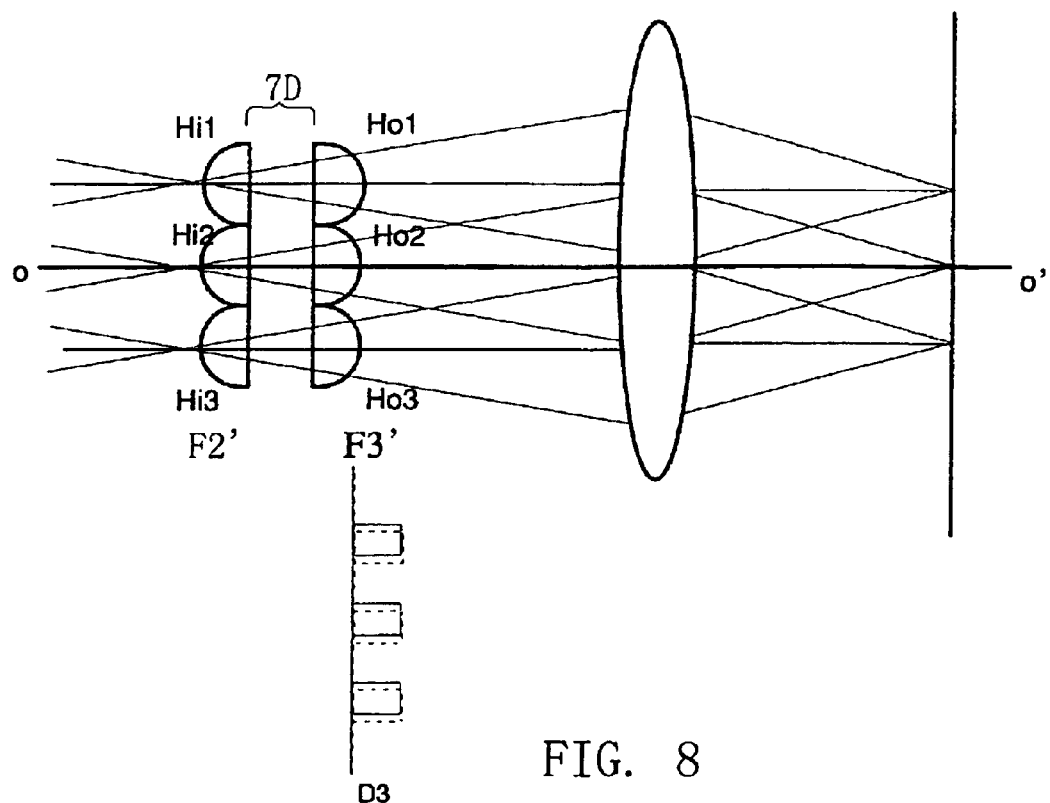
FIG. 8 is a schematic diagram showing an optical arrangement of a fly-eye lens.

Referring now to FIG. 8, a description will be given of how to solidify the effective light source with a higher accuracy. Here, FIG. 8 is a schematic drawing showing an optical arrangement of a fly-eye lens 7D used as a common optical integrator. Even the above conjugate arrangement would cause a positional shift in the bright point in the element (light exit edge) of the fly-eye lens 7D when the light emission point Pt fluctuates its position.

Arranged at the incident side of the exposure light (light source side) are rows of Hi1, Hi2, and Hi3, and at the back of which rows of matching Ho1, Ho2, and Ho3 at the exiting side (reticle side). When the light emission point Pt changes its position now, there is no change in the light amount distribution at the incident plane F2' of the fly-eye lens 7D because of the above conjugate arrangement, but the beam incident upon this plane changes its angle. It is in effect seen as a shift of the condensing point on the respective exiting-side fly-eye lenses Ho1, Ho2, and Ho3. Such a shift at the exiting side of the fly-eye lenses 7D are shown as D3 in a typical way. This phenomenon substantially causes an offset in the center of gravity of the effective light source distribution.

Figure 7:
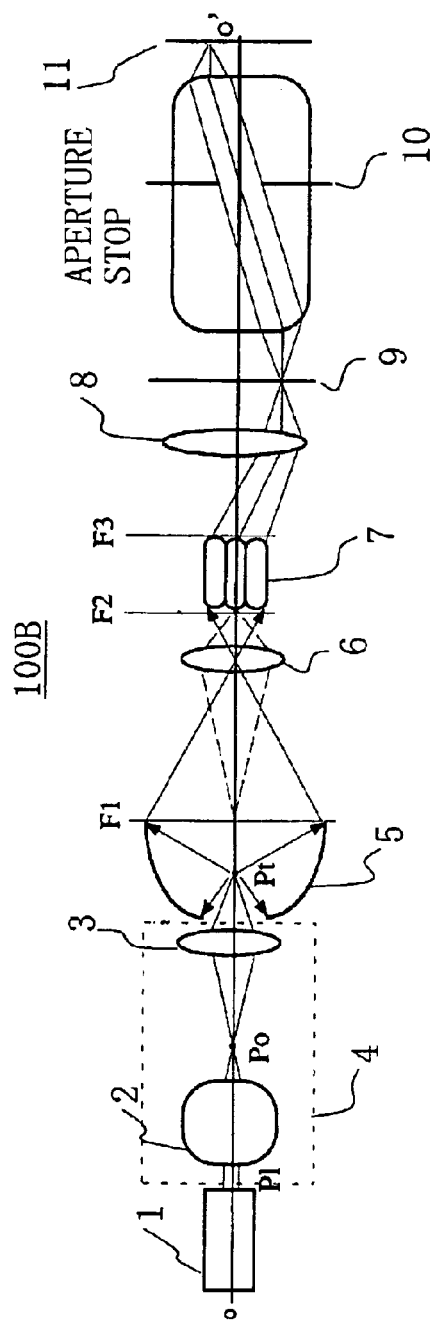
FIG. 7 is a schematic diagram showing an exposure apparatus of a third embodiment of the present invention.

Accordingly, given the inventive excitation optical system 4, the positional change of the light emission point Pt can be minimized for the same reason as described in the above embodiments, and therefore, the effective light source can constantly provide stable exposure beams without changing its outward shape or its inward gravity. Since this embodiment uses a mirror system, F2 and F3 in FIG. 7 agree with each other.

Figure 9:
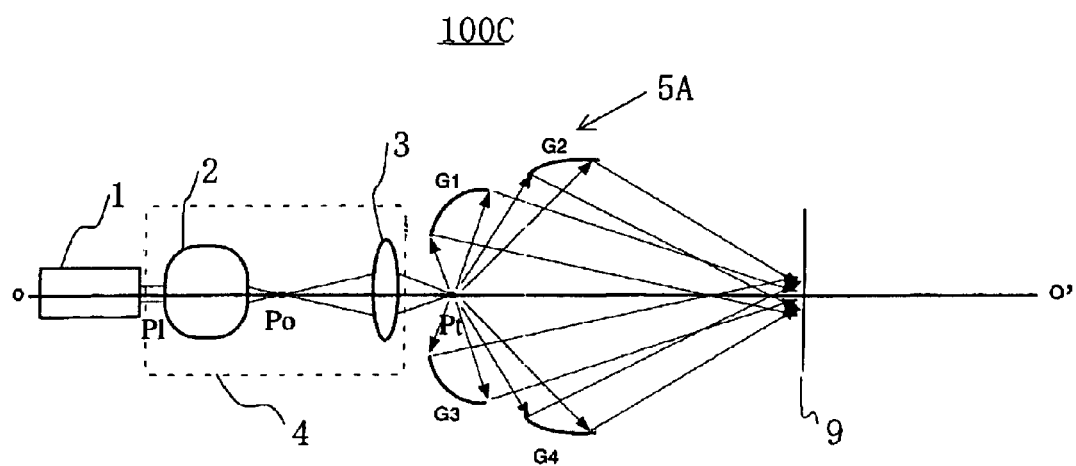
FIG. 9 is a schematic diagram showing an exposure apparatus of a fourth embodiment of the present invention.

Referring now to FIG. 9, a description will now be given of an exposure apparatus 100C of a fourth embodiment of this invention. The exposure apparatus 100C of this embodiment is an example that uses a plurality of mirrors as a condensing mirror system. For simplicity, a description of the projection optical system 10 is omitted since it is the same as those used in the above embodiments. It is advantageous from a partial coherence theory that the effective light source has some degree of spread relative to the NA of the projection optical system 10.

Therefore, the exposure apparatus 100C uses a condensing mirror system 5A in place of the condensing mirror system 5. The condensing mirror system 5A includes a plurality of mirrors (G1, G2, G3, and G4), illuminating the reticle 9 from different angles as well as forming a common illumination area on the reticle 9. An application of this invention to such an optical system would minimize illumination distribution changes (mainly uneven illuminance in this case) on the reticle 9 caused by the positional change of the light emission point Pt. Here, the condenser mirror system 5A may use a spheroidal mirror, which is divided into multiple mirrors, as shown in FIG. 9.

Figure 12:
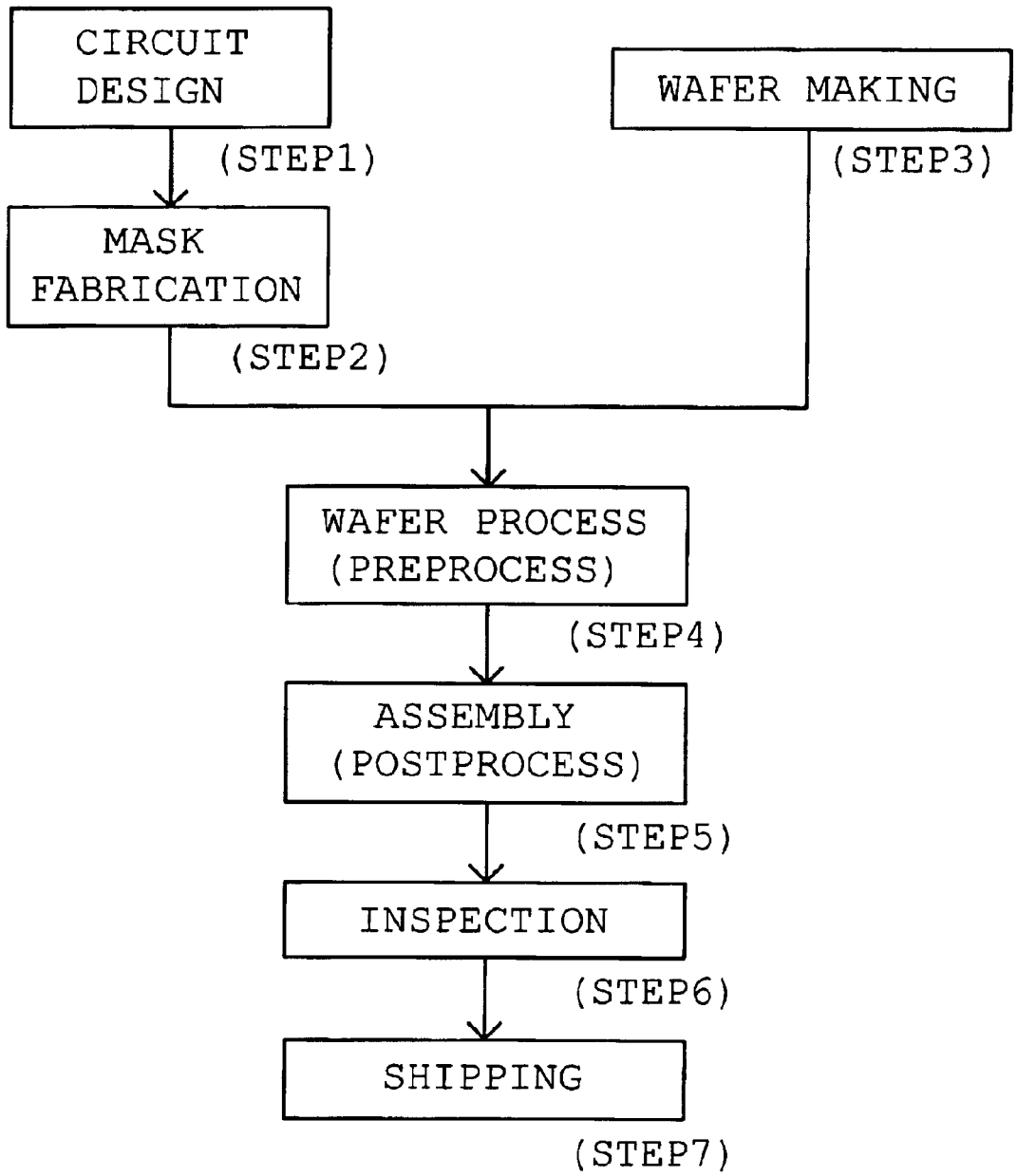
FIG. 12 is a flowchart for explaining how to fabricate devices (such as semiconductor chips such as ICs and LSIs, LCDs, CCDs, and the like).
Figure 13:
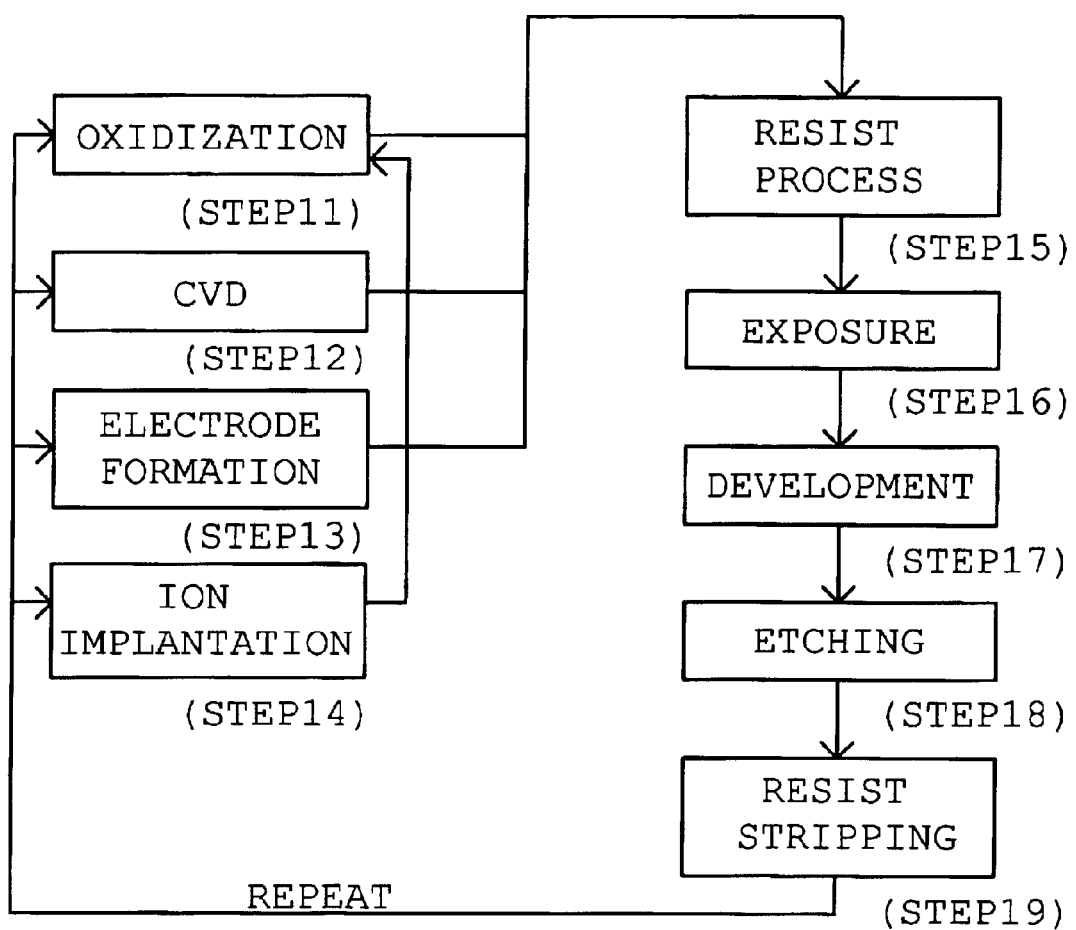
FIG. 13 is a flowchart for Step 4 that is a wafer process shown in FIG. 12.

Referring to FIGS. 12 and 13, a description will now be given of an embodiment of a device fabricating method using the above mentioned exposure apparatus 100. FIG. 12 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The fabrication method of the instant embodiment may manufacture higher quality devices than the prior art. In this manner, the device fabricating method that uses such an exposure apparatus 100 and the device as a final product serve as other aspects according to the present invention.

Further, the present invention is not limited to these preferred embodiments, but various modifications and variations may be made without departing from the spirit and scope of the present invention. For example, the excitation light of the present invention is not limited to the EUV light, but may use X-ray having a wavelength shorter than the EUV light. The present invention is widely applicable to an optical system that generally uses a first light source as an excitation light source to emit light to a second light source.

Thus present embodiments may provide an illumination system that is not easily affected by light source fluctuation while decreasing the number of optical members in a lithography using the EUV light. This stabilizes baking pattern's property, and improves a remarkable yield in a device manufacturing step. An optical system of fewer members increases its light utilization efficiency, and higher illuminance on a wafer with a light source of the same power, thus drastically improving device mass production.

This invention may provide a light emitting apparatus, an illumination apparatus using the same, an exposure apparatus, and a device fabrication method, in which a light emission point for generating the EUV light or X-ray having a wavelength shorter than an EUV ray is not easily affected by fluctuations in an light exit direction of a beam from an excitation beam light source.

What is claimed is:

1. A light producing apparatus for irradiating a beam from a light source to a target for exciting the target, and causing the target to emit light, said light producing apparatus comprising:
   a first condensing optical system for condensing the beam from the light source; and
   an imaging optical system for imaging onto the target under a demagnification a condensing point of the beam by said first condensing optical system.

2. An illumination apparatus for illuminating illuminated plane using light produced by a light producing apparatus for irradiating a beam from a light source to a target for exciting the target, and for causing the target to emit light, said light producing apparatus comprising a first condensing optical system for condensing the beam from the light source, and an imaging optical system for imaging onto the target under a demagnification a condensing point of the beam by said first condensing optical system.

3. An illumination apparatus according to claim 2, wherein the light produced by said light producing apparatus has a wavelength of 20 nm or less.

4. An illumination apparatus according to claim 2, comprising:
   a second condensing optical system for condensing the light from the light producing apparatus;
   an optical integrator for receiving light from said second condensing optical system; and
   a first condenser system for superimposing a plurality of beams emitted from said optical integrator onto the illuminated plane.

5. An illumination apparatus according to claim 4, wherein said second condensing optical system comprises:
   a condensing mirror for condensing light from said light producing apparatus; and
   a second condenser system for condensing light from the condensing mirror into said optical integrator,
   wherein an aperture of the condensing mirror and an incident surface of said optical integrator are arranged optically conjugate with each other.

6. An illumination apparatus according to claim 4, wherein said second condensing optical system comprises:
   a condensing mirror for condensing light from said light producing apparatus; and
   a second condenser system for condensing light from the condensing mirror into the optical integrator, and
   wherein the target of said light producing apparatus and an incident surface of the optical integrator are arranged optically conjugate with each other.

7. An illumination apparatus according to claim 2, further comprising a second condensing optical system for condensing light from said light producing apparatus onto the illuminated plane, said second condensing optical system comprising a plurality of condensing mirrors, wherein respective beams from the plurality of condensing mirrors illuminate a common illumination region on the illuminated plane.

8. An illumination apparatus according to claim 2, wherein a beam from the light source is a laser beam.

9. An illumination apparatus according to claim 2, wherein a beam from the light source is an electron beam.

10. An exposure apparatus that illuminates a pattern of an original by using an illumination apparatus having a light producing apparatus for irradiating a beam from a light source to a target for exciting the target, and for causing the get to emit light, said light producing apparatus comprising a first condensing optical system for condensing the beam from the light source, and an imaging optical system for imaging onto the target under a demagnification a condensing point of the beam by said first condensing optical system.

11. A device fabrication method comprising the steps of:

exposing an object with a device pattern by using an exposure apparatus that illuminates a pattern of an original by using an illumination apparatus having light produced by a light producing apparatus for irradiating a beam from a light source to a target for exciting the target, and for causing the target to emit light, said light producing apparatus comprising a first condensing optical system for condensing the beam from the light source, and imaging optical system for imaging onto the target under a demagnification a condensing point of the beam by said first condensing optical system; and performing a predetermined process for the object exposed.

12. A light producing apparatus for irradiating a beam from a lights source to a target for exciting the target, and causing the target to emit light, said light producing apparatus comprising:

a condensing optical system for changing the beam from the light source to a beam that diverges from a condensing point as a virtual image; and an imaging optical system for imaging onto the target under a demagnification the condensing point.

* * * * *